United States Patent [19]

Tedrow et al.

[11] Patent Number: 5,339,272

[45] Date of Patent: Aug. 16, 1994

[54] PRECISION VOLTAGE REFERENCE

[75] Inventors: Kerry Tedrow, Orangevale; Mase Taub, Elk Grove; Neal Mielke, Los Altos Hills, all of Calif.

[73] Assignee: Intel Corporation, Santa Clara, Calif.

[21] Appl. No.: 993,408

[22] Filed: Dec. 21, 1992

[51] Int. Cl.$^5$ ............................................. G05F 1/56
[52] U.S. Cl. .................. 365/189.09; 307/296.1; 307/296.6; 323/316; 323/315
[58] Field of Search ............ 307/296.1, 296.2, 296.3, 307/296.4, 296.5, 296.6, 296.8; 323/312, 313, 314, 315, 316; 365/189.09, 189.06

[56] References Cited

U.S. PATENT DOCUMENTS

| | | | |
|---|---|---|---|
| 4,317,054 | 2/1982 | Caruso et al. | 307/296.8 |
| 4,902,959 | 2/1990 | Brokaw | 323/314 |
| 4,959,900 | 9/1990 | Vider | 365/185 |
| 5,081,410 | 2/1992 | Wood | 307/296.1 |

Primary Examiner—Eugene R. LaRoche
Assistant Examiner—Vu A. Le
Attorney, Agent, or Firm—Blakely, Sokoloff, Taylor & Zafaman

[57] ABSTRACT

A precision voltage reference circuit which includes a pair of similar flash EEPROM memory cells, each of the pair of similar flash EEPROM memory cells having a different charge on its floating gate; circuitry for connecting each of said cells in a pair of parallel circuits in which equal current values are generated in an equilibrium condition; apparatus for sensing a voltage in each of said pair of parallel circuits to provide an output voltage which may be used as a reference value when the currents are in equilibrium; and apparatus for sensing variations in the output voltage to vary the current through the flash EEPROM memory cells to bring the currents into equilibrium when the reference voltage varies from the voltage provided at equilibrium.

11 Claims, 4 Drawing Sheets

PRECISION VOLTAGE REFERENCE

BACKGROUND OF THE INVENTION

1. Field Of The Invention

This invention relates to semiconductor circuits and, more particularly, to methods and apparatus for providing a precision voltage reference utilizing a pair of flash EEPROM memory cells.

2. History Of The Prior Art

Precision voltage references are well known in the prior art. There have been many circuit arrangements for providing such references. However, as circuits become more and more specialized, it becomes necessary to produce such voltage references using the processes available for producing the associated circuitry. For example, the use of voltage references with large scale integrated circuits may require that the circuitry for producing the reference voltages be manufactured by the processes used for manufacturing the large scale integrated circuits. Thus, it may be possible to provide a precision voltage reference easily where individual components including precision resistors and capacitors are available. However, where integrated circuit devices must be used and both the currents and voltage which may be used by such devices are limited, the ability to provide such references becomes much more difficult. Consequently, the components available for providing such voltage references become more and more limited as the type of integrated circuits becomes more specialized and as the individual elements of the circuitry become smaller and the area more restricted.

One type of integrated circuit which utilizes precise voltage levels is a memory array. Normally, precision voltages are available from external circuitry for interrogating a memory array during a read process or for writing to such an array. However, newer flash EEPROM memory arrays used for long term storage in portable computers are designed to operate with microprocessors which use lower source voltages and do not have precision power supplies available to provide the precise higher voltage values required for programming and erasing such flash arrays. Consequently, it is necessary to generate such precision voltage references within the integrated circuit which contains the array or its control circuitry. This requires that the elements needed for providing the precision voltage references be produced by the process used in manufacturing the flash memory array.

SUMMARY OF THE INVENTION

It is, therefore, an object of the present invention to provide a precision voltage reference for an integrated circuit.

It is another more specific object of the present invention to provide a precision voltage reference for an integrated circuit which utilizes a pair of flash EEPROM memory cells to establish and maintain a voltage reference level.

It is yet another object of the present invention to provide a precision voltage reference for a flash memory array which reference circuitry is manufactured using the processes used for manufacturing the memory array.

These and other objects of the present invention are realized in a precision voltage reference circuit comprising a pair of similar flash EEPROM memory cells each having a source, drain, floating gate, and control gate, each of the pair of similar flash EEPROM memory cells being programmed to have a different charge on its floating gate; means for connecting each of said cells in a pair of parallel circuits in which equal current values are generated in an equilibrium condition; means for sensing a voltage in each of said pair of parallel circuits to determine when the currents therein differ to provide an output voltage which may be used as a reference value when the currents are in equilibrium; and means for sensing variations in the output voltage to vary the current through the flash EEPROM memory cells to bring the currents into equilibrium when the output voltage varies from the reference value provided at equilibrium.

These and other objects and features of the invention will be better understood by reference to the detailed description which follows taken together with the drawings in which like elements are referred to by like designations throughout the several views.

DETAILED DESCRIPTION

Figure 1:
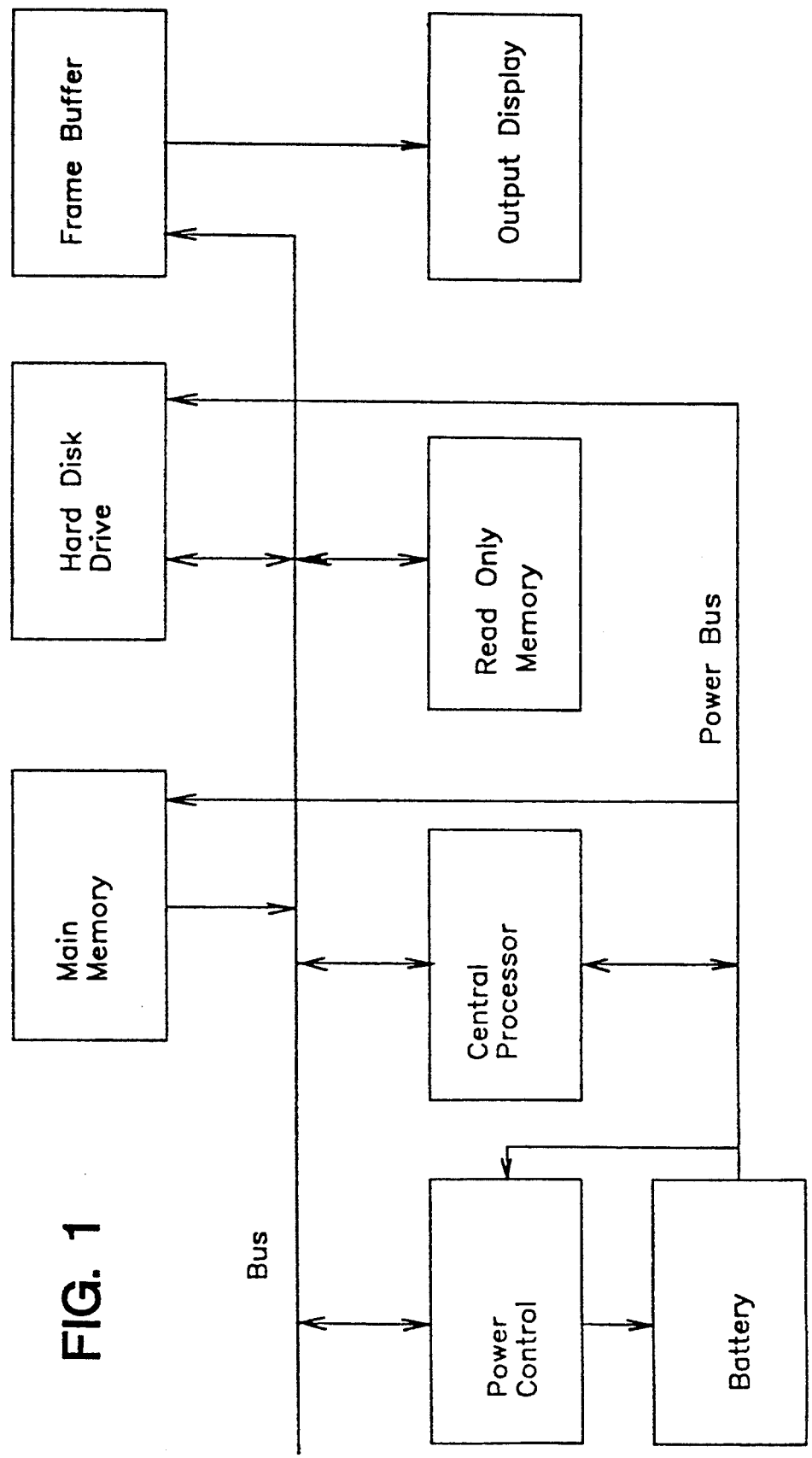
FIG. 1 is a block diagram of a computer system utilizing the present invention.

Referring now to FIG. 1, there is illustrated a computer system which utilizes the present invention. The system typically includes a central processor which carries out the various instructions provided to the computer for its operations. The central processor is joined to a bus adapted to carry information to various components of the computer system. Joined to the bus is main memory which is typically constructed of dynamic random access memory used to store information during the period in which power is provided to the system. Also joined to the bus is read only memory which may include various memory devices (such as electrically programmable read only memory devices (EPROM devices) or flash EEPROM memory devices) well known to those skilled in the art which are adapted to retain a memory condition in the absence of power to the system. The read only memory typically stores various basic functions used by the processor 11 such as basic input/output and startup processes.

Also connected to the bus are various peripheral circuit components such as long term memory exemplified by a hard disk drive in the figure. Also joined to the bus is circuitry such as a frame buffer to which data may be written which is to be transferred to an output display device such as a monitor for display. For the purposes of the present explanation, the frame buffer may be considered to include in addition to various memory planes necessary to store information, various circuitry well known to those skilled in the art such as digital to analog converter circuitry and circuitry for controlling the scan of information to the output display.

Circuitry is also shown in FIG. 1 by which power may be supplied to the computer system. This includes in the exemplary embodiment a power control circuit which controls the various states for applying power to the system and a battery which may be utilized in a portable computer for furnishing power to the system under control of the power control circuitry. In any particular arrangement, the power control circuitry may actually be a part of a particular portion of the circuit of FIG. 1. For example, if the read only memory were to be constructed of flash EEPROM memory devices, power control circuitry include voltage reference circuitry in accordance with the present invention might be a physical portion of the read only memory block.

Figure 2:
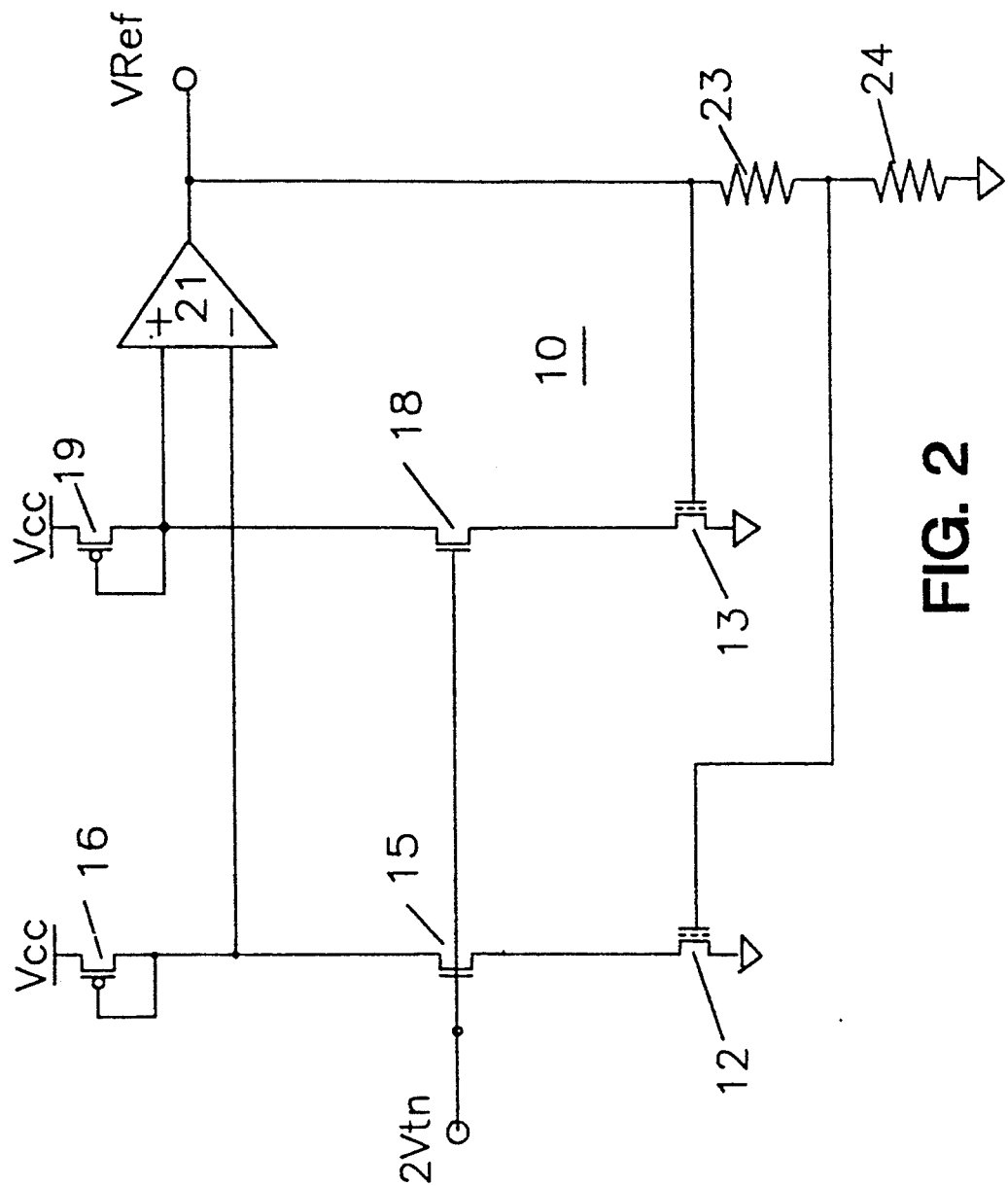
FIG. 2 is a basic circuit diagram of the present invention.

Referring now to FIG. 2, a basic circuit 10 designed in accordance with the present invention is illustrated. This basic circuit 10 is especially useful in explaining the manner of operation of the present invention. The circuit 10 includes a pair of essentially identical flash electrically-erasable programmable read only memory (EEPROM) devices 12 and 13.

A flash EEPROM memory device (cell) is a floating gate MOS field effect transistor having a drain region, a source region, a floating gate, and a control gate. Conductors are connected to each of the drain, source, and control gate for applying signals to the transistor. A flash EEPROM cell is capable of functioning in the manner of a normal EPROM cell and will store a one or a zero condition when power is removed from the circuitry. Unlike a typical EPROM cell, a flash EEPROM cell is electrically erasable in place and does not need to be removed and diffused with ultraviolet to accomplish erasure of the memory cells.

An N type flash memory transistor is typically programmed by negatively charging the floating gate by coupling the control gate to a high potential (this may be approximately +12 volts when the cell is used as a memory cell in an array), the drain region to a lower voltage (approximately +7 volts when the cell is used as a memory cell), and the source region to ground. With these conditions, charge is stored on the floating gate. A cell is read by applying a positive potential between the control gate and the source region while and applying a low positive potential to the drain region. The read voltage applied between the gate and source is greater than the threshold voltage Vt of a device which has not been programmed but less than the threshold voltage of a device which has been programmed. Current through the device is sensed to determine if the floating gate is or is not negatively charged. If there is charge on the floating gate, then no drain current flows when a cell is read. In contrast, if the transistor has not been programmed and no charge exists on the floating gate, then drain current flows when the cell is read.

Arrays of such flash EEPROM memory cells have recently been used in computers and similar circuitry as both read only memory and as long term storage which may be both read and written. These cells require accurate values of voltage be furnished in order to accomplish programming and reading of the devices. Arrays of flash EEPROM memory devices are typically used for long term storage in portable computers where their light weight and rapid programming ability offer distinct advantages over electro-mechanical hard disk drives. However, the tendency has been to reduce the power requirements of such portable computers to make the computers lighter and to increase the length of use between recharging. This has required that the potentials available to program the flash memory arrays be reduced. Where precision voltage references have long been available in circuitry within portable computers for use in programming flash arrays, this is no longer true. Therefore, it is now necessary to provide such precision voltage references within the circuitry for controlling the flash EEPROM memory array. This requires that the precision voltage reference circuitry be producible with the processes used for manufacturing the control circuitry of the flash EEPROM memory array which is used in place of a hard disk drive.

The circuit 10 of the present invention is therefore designed to be produced by a conventional CMOS process using the same techniques that those skilled in the art utilize to produce flash EEPROM memory arrays.

The flash EEPROM cells 12 and 13 should not, however, be considered as memory array cells; for even though they are constructed in the same manner using the same processes, as will be explained, they are used to store two different selected charge values rather than the charge values typically used for such devices. The flash device 12 has its source and drain terminals connected in series with the source and drain terminals of an N type field effect transistor device 15 and the source and drain terminals of a P type field effect transistor device 16. The P type device 16 has its gate terminal connected to its drain terminal so that it functions like a resistor. The N type device 15 is a cascode device used to maintain the voltage at the drain terminal of the flash device 12 at a voltage which is a threshold voltage Vt of the device 15 below the gate voltage of the cascode device 15.

The flash device 13 has its source and drain terminals connected in series with the source and drain terminals of an N type field effect transistor device 18 and the source and drain terminals of a P type field effect transistor device 19. The P type device 19 is sized identically to the P type device 16 and has its gate terminal connected to its drain terminal so that it also functions like a resistor. The N type device 18 is a cascode device identical to the cascode device 15 and is also used to maintain the voltage at the drain terminal of the flash device 13 at a voltage which is a voltage Vt below the gate voltage of the cascode device 18.

The drain terminal of the P device 16 is connected to the negative input of a differential amplifier 21 while the drain terminal of the P device 19 is connected to the positive input of the differential amplifier 21. The amplifier 21 provides an output potential at a terminal which may be measured above ground potential across a pair of resistors 23 and 24. The voltage at the output terminal is the reference voltage controlled by the circuit 10. The resistor 23 is one-half the value of the resistor 24 in one embodiment of the invention.

Since the resistor 23 is one-half the value of the resistor 24, the voltage difference between the output terminal and ground divides so that the gate of the flash device 12 receives two-thirds of the voltage which the gate of the flash device 13 receives. During manufacture, each of the flash devices is programmed to hold a different charge on its floating gate. The values of the charges are selected such that when the circuit 10 is in equilibrium providing the desired output value to be used as a reference voltage, the currents through the two flash devices are equal, the voltages across the capacitors formed by the floating gates and the fields of each flash device are equal, and the drain voltages are equal. In this condition, the gate voltages provided by the resistor divider network of resistors 23 and 24 are just appropriate to maintain the equal current through the two devices 12 and 13. This means that the threshold voltage Vt of the device 13 is greater than the threshold voltage Vt of the device 12, and this is in fact the way in which the devices 12 and 13 are programmed so that when the voltage at the gate of the device 12 is two-thirds that of the voltage at the gate of the device 13, equal currents are produced.

If the output reference voltage shifts, this must be because the current through one of the two flash devices has changed. For example, if the current through the device 12 increases, then the current through and the voltage across the device 16 also increase. This lowers the level of the voltage at the drain of the device 16 and at the negative input of the amplifier 21. This applies a larger voltage across the differential inputs to the amplifier 21 and causes a positive change, an increase, in the output voltage of the amplifier 21. This, in turn, will raise the voltage level at the gate terminals of the flash devices 12 and 13. The voltage at the gate terminal of the device 13 is changed by a proportionally greater amount than is the gate terminal of the device 12. This increased gate voltage increases the current through the flash device 13 and the P device 19 thereby lowering the voltage at the drain terminal of the device 19 and at the positive input to the amplifier and counteracting the original increase in current through the device 12. A change in another sense through either of the devices 12 or 13 will have a similar effect in balancing the current and maintaining the output voltage at the steady reference output level.

Figure 3:
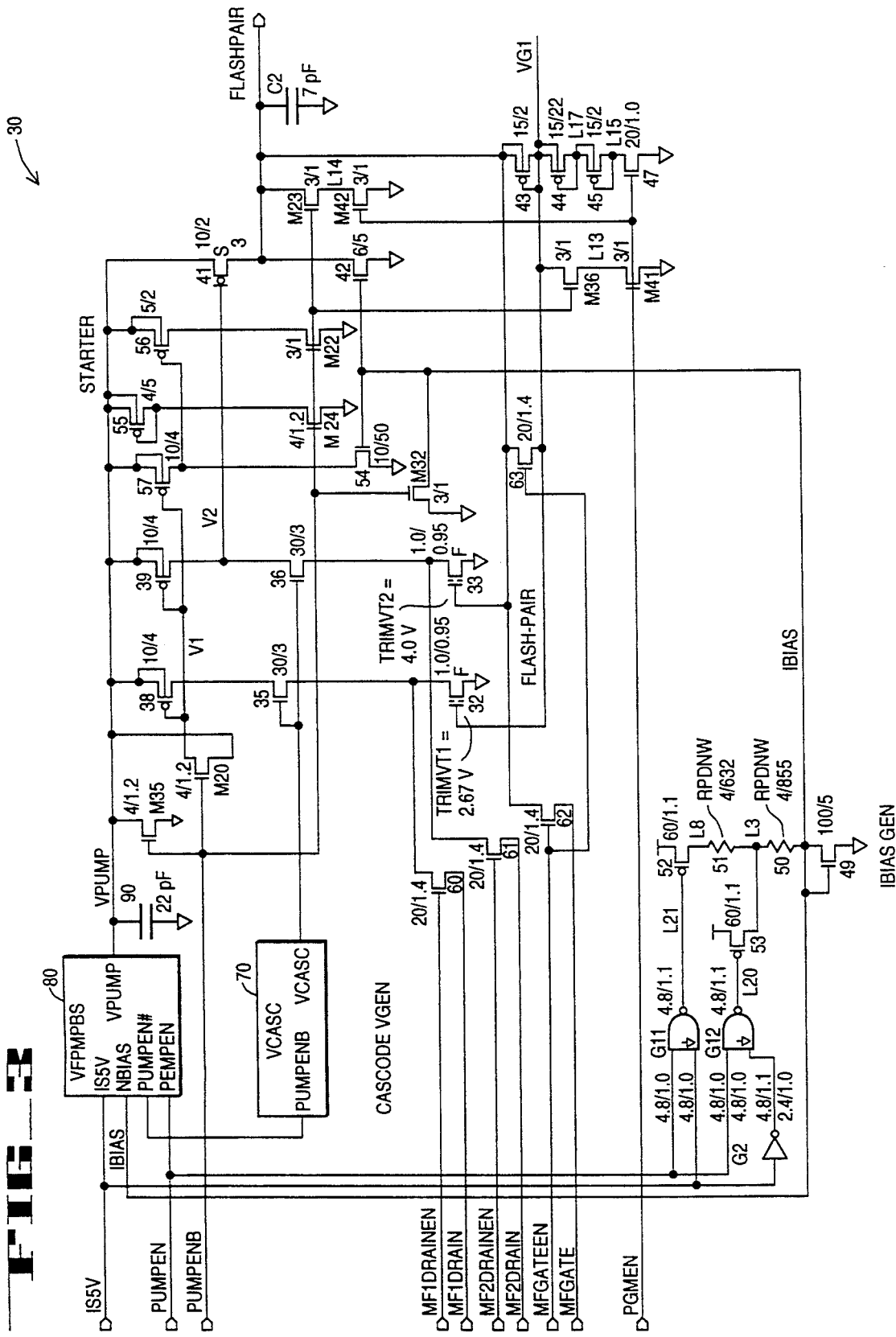
FIG. 3 is a more detailed circuit diagram illustrating the present invention.

FIG. 3 is a circuit diagram of a circuit 30 utilizing the invention. The circuit 30 includes a pair of identically dimensioned flash EEPROM devices 32 and 33. These devices and the other devices illustrated in FIG. 3 are constructed utilizing typical CMOS techniques well known to those skilled in the art for producing flash EEPROM memory arrays and have the channel width and length dimensions listed in the figure. Connected in series with the source and drain terminals of the devices 32 and 33 are the source and drain terminals of a pair of cascode devices 35 and 36 and the source and drain terminals of a pair of identically dimensioned P devices 38 and 39. As in the circuit of FIG. 2, the P device 38 has its gate terminal connected to its drain terminal and essentially functions as a resistor. The source of each P device 38 and 39 is connected to a source of potential Vpump (a value furnished by a current pump circuit 80). The gate of the device 39, however, is connected to the drain and gate of the device 38 so that the device 39 acts as a current mirror of the current through the device 38 and thus through the device 32.

The drain of the device 39 is connected to the gate of an N type device 41. The N type device 41 is a FET having a lower value of threshold voltage Vt than a conventional N type FET used to reduce power dissipation. The device 41 is connected to ground through an N device 42 which is biased to act as a constant current source. The device 41 is connected as a source follower so that the voltage at its source terminal essentially follows the voltage at its gate terminal less the threshold voltage Vt of the device 41. Thus, when the current changes through the flash device 33 and the voltage at the gate of the device 41 changes, this is reflected at the source terminal of the device 41 which is the output node from which the precision reference voltage is derived.

The reference voltage is provided across three P devices 43, 44, and 45 each of identical size connected in series, each with its gate connected to its drain so that it functions as a resistor. Each of the P devices 43, 44, and 45 has its substrate connected to its source terminal to eliminate any shifting of threshold voltage when there is a potential between the source terminal and the substrate; this helps to ensure that the devices act like ideal resistor in a voltage divider network. An N type device 47 which is biased into its linear operation region provides ground at the drain of the device 45. Thus, a first voltage level is applied to the gate of the flash device 33 and two-thirds that voltage level is applied to the gate of the flash device 32. These values maintain the gate voltages of the flash devices 32 and 33 such that the voltage reference value Vref at the output terminal is precisely maintained at the desired value.

For example, if the current through the flash device 32 drops below a value equal to the current through the flash device 33, this drop in current causes a drop in the voltage across the device 38 and an increase in voltage at the drain of the device 38. This voltage level is applied to the gate of the device 39 causing a decrease in the gate-to-source voltage of the device 39. This causes the device 39 to attempt to reflect the drop in current through the device 38. At the same time, the flash device 33 is generating current at its previous level and attempts to transfer this value of current through the device 39. Lowering the gate/source voltage of the device 39 while attempting to maintain the higher current from the flash device 33 causes the device 39 to operate in a region in which its drain/source voltage increases. Thus, these two conflicting currents cause the voltage applied to the gate terminal of the device 41 to lower. This lowers the potential across the three devices 43, 44, and 45. This lowers the gate voltage at the device 33 by somewhat more than the gate voltage at the device 32 and brings the two currents back into equilibrium. A change in another sense through either of the devices 32 or 33 will have a similar effect in balancing the current and maintaining the output voltage Vref at the steady reference level.

The circuit 30 includes circuitry for establishing bias values so that the devices operate in the appropriate regions. An N type device 49 is connected to ground potential and has its gate connected its drain. A pair of diffusion resistors 50 and 51 join the drain of the device 49 to a P type switch 52 which is connected to the source voltage Vcc. Another P type switch 53 is connected to Vcc and between the diffusion resistors 50 and 51. A five volt input signal at the gate of the device 52 provides a current path through the device 49 and a selected voltage drop across the device 49. A 3.3 volt input signal at the gate of the device 53 provides a current path through the device 49 and the same voltage drop across the device 49. This voltage level is used to provide identical biasing for the devices of the circuit 30 when five volts is available externally and when 3.3 volts is available externally.

The voltage across the device 49 is applied to the gate of the device 42 and the gate of a device 54. These devices are connected with their sources joined to ground and their gate terminals at the voltage of the gate terminal of the device 49. Consequently, the devices 42 and 54 act as ratioed current mirrors of the current through the device 49 so that current through these devices will never exceed the saturated value established by the current mirror.

The weak N device 54 has its drain connected to the gate of a P type device 56. The device 56 has its source joined to the voltage source Vpump and its drain to the gate of the device 41. A P device 55 is connected to the voltage source Vpump and the gate terminal of the device 56. The device 56 (with the devices 54, 55, and a device 57) is used to assure a quick startup (approximately 500 ns.) for the circuit 30 at turn on and to make sure that it does not operate in the equilibrium condition at which the currents through the two flash devices 32 and 33 are zero.

When no current flows through the flash devices, the devices 54 and 55 act as a voltage divider to apply a voltage just a value Vt (of the device 55) less than the voltage level Vpump to the gate of the device 56. This enables the device 56 and raises the voltage at the gate of the device 41 so that device operates and raises the gate voltages of the flash devices 32 and 33 to increase the current through those flash devices. A P device 57 is connected to mirror the current through the device 38 (and thus through the flash device 32). When the current through the flash device 32 is raised sufficiently, the device 57 acting as a resistor and mirroring that current raises the voltage at the gate of the device 56 gradually shutting that device off. Thus the circuit 10 starts up quickly and comes to the appropriate equilibrium condition while the starter transistor 56 drops out of the picture. In view of the fact that one embodiment of the circuit 30 is turned on each time an associated flash memory array is programmed, read, or erased, this quick start up property is very desirable.

In addition to the circuitry already discussed, the circuit 30 includes a number of input terminals which may be utilized for applying programming voltages to the flash EEPROM devices 32 and 33 to place the values of charge stored on the floating gates at exactly the values desired to provide the correct equilibrium points. An N type FET device 60 may be selected to apply a voltage from an external terminal to the drain of the flash device 32. A similar N type FET device 61 may be selected to apply a voltage from an external terminal to the drain of the flash device 33. Another N type FET device 62 cooperates with an N type FET device 63 to apply the same voltage from another external terminal to the gates of each of the devices 32 and 33 during programming. By manipulating the values applied to the external pads, the charge values placed on the floating gates of the flash devices 32 and 33 may trimmed to the exact charge values desired to produce the desired precision reference voltage at the output terminal.

A circuit 70 shown as a block in FIG. 3 is utilized to provide the correct gate voltages (twice the Vt of the devices 35 and 36) to each of the cascode devices 35 and 36 so that the voltage at the drain of each of the flash devices 32 and 33 is maintained at the proper value of voltage (Vt of the cascode devices) for equilibrium operation. This controls the drain voltages of the flash devices 32 and 33 to remain at a voltage level equal to the voltage Vt of the cascode devices.

Figure 4:
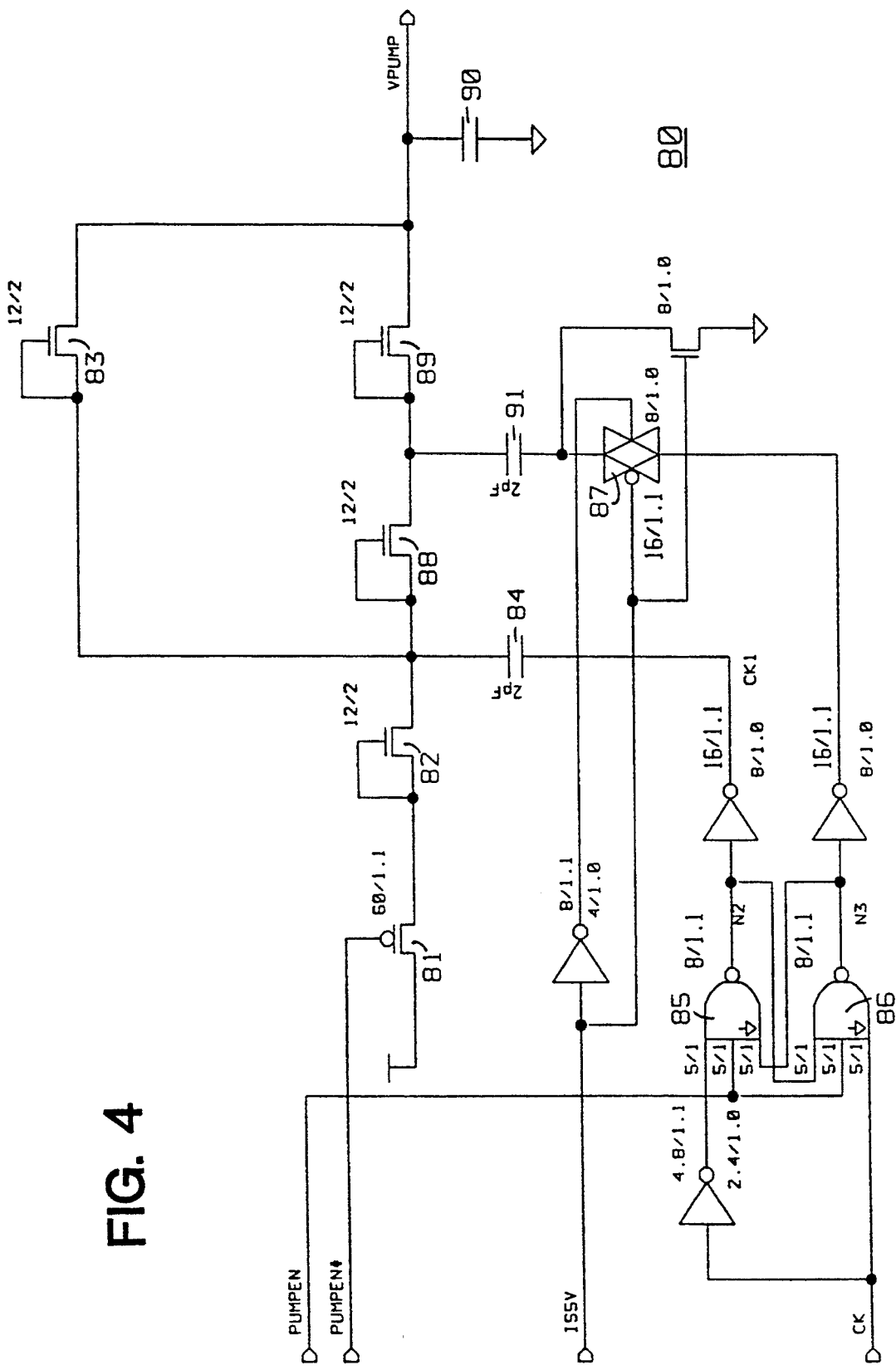
FIG. 4 is a circuit diagram of a portion of the circuit illustrated in FIG. 3.

Because the circuit 30 requires a power supply of at least six volts, a current pump arrangement is utilized for furnishing the voltage Vpump at the sources of the devices 38 and 39 when either five volts or three volts is available at an input terminal as a source voltage Vcc. FIG. 4 illustrates a current pump circuit 80 which may be utilized for this purpose. The circuit 80 has a P type device 81 connected to provide current from source Vcc. The device 81 is joined to a first diode-connected (gate terminal connected to drain terminal) N type device 82 and a second diode-connected N type device 83 in a first path to an output terminal at which the voltage Vpump appears. The device 81 is also joined to two additional diode-connected N type devices 88 and 89 which provide a second path to the output terminal at which the voltage Vpump appears. Each of the devices 82, 83, 88, and 89 are N type devices having an especially low value of threshold voltage.

A clock input signal CK which varies between Vcc and ground is provided to a NAND gate 85 and is inverted and provided to a NAND gate 86. The NAND gate 85 or 86 are enabled to transfer the clock signal by a pump enable input signal PUMPEN. Feedback from the output of each of the NAND gates 85 and 86 to the input of the other NAND gate assures that the NAND gates 85 and 86 transfer two streams of clock signals which are non-overlapping and exactly out of phase.

When the current pump 80 is enabled by application of the signal PUMPEN, a signal PUMPEN# is low causing the device 81 to provide Vcc at the drain of the N device 82. When the value of Vcc is five volts, a signal IS5V is provided to disable a transmission gate switch 87 so that the clock signal from the NAND gate 85 is cut off. In such a case, the clock signal from the NAND gate 86 is applied between the devices 82 and 83. When the value of the clock is negative, the device 82 is enabled so that the source Vcc connected through the device 81 charges a capacitor 84. When the clock is positive, the device 82 is disabled while the device 83 is enabled. The device 83 then connects the capacitor 84 to the output so that the Initial value Vcc stored during the negative half cycle and the additional value Vcc furnished by the positive clock signal are sent to the output as the voltage Vpump. This, in effect, doubles the output voltage available at the output terminal to the desired value.

When the voltage Vcc is three volts on the other hand, the switch 87 conducts the clock signals to a node between the two additional N devices 88 and 89. These devices function in the same manner as the devices 82 and 83 to charge a capacitor 91 so that an additional charge is accumulated during the negative half of the clock signal through the NAND gate 85 and an additional voltage is applied at the output of the circuit 80. Thus, the first negative clock applied between the devices 82 and 88 enables the device 82 and accumulates charge on the capacitor 84. When this clock goes positive (and the clock through NAND gate 85 is negative), the device 88 is enabled and the capacitor 91 is charged. Then, when the value at the node between the devices 88 and 89 goes positive, the value stored by the capacitor 91 and the value of the positive clock are furnished by the enabled device 89 to the output. In this manner, the voltage at Vpump is increased to the desired value for either a five volt or a three volt value of Vcc. The voltage Vpump charges a capacitor 90 so that when the path through the devices 88 and 89 is enabled, the output voltage Vpump disables the device 83.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A precision voltage reference circuit comprising a pair of similar flash EEPROM memory cells each having a source, drain, floating gate, and control gate, each of the pair of similar flash EEPROM memory cells having a different charge on its floating gate; means for connecting each of said cells in a pair of parallel circuits in which equal current values are generated in an equilibrium condition; means responsive to currents in the pair of parallel circuits for providing an output voltage which may be used as a reference value when the currents are in equilibrium; and means for sensing variations in the output voltage to vary the current through the flash EEPROM memory cells to bring the currents into equilibrium when the output voltage varies from the voltage provided at equilibrium.

2. A precision voltage reference circuit as claimed in claim 1 in which the means for sensing variations in the output voltage to vary the current through the flash EEPROM memory cells to bring the currents into equilibrium when the output voltage varies from the voltage provided at equilibrium comprises:

resistive means arranged to provide a voltage divider network, and means for sensing the voltage at different points of the voltage divider network to furnish control gate voltages for the flash EEPROM memory cells.

3. A precision voltage reference circuit as claimed in claim 2 in which the resistive means comprises P type FET devices with source and drain terminals connected in series between the output voltage and a second level of potential and having gate terminals connected to drain terminals.

4. A precision voltage reference circuit as claimed in claim 1 in which the means responsive to currents in the pair of parallel circuits for providing an output voltage which may be used as a reference value when the currents are in equilibrium comprises a differential amplifier, and means for providing voltages indicative of the currents in the pair of parallel circuits as inputs to the differential amplifier.

5. A precision voltage reference circuit comprising a pair of similar flash EEPROM memory cells each having a source, drain, floating gate, and control gate, each of the pair of similar flash EEPROM memory cells having a different charge on its floating gate; means for connecting each of said cells in a pair of parallel circuits in which equal current values are generated in an equilibrium condition; means responsive to currents in the pair of parallel circuits for providing an output voltage which may be used as a reference value which the currents are in equilibrium; and means for sensing variations in the output voltage to vary the current through the flash EEPROM memory cells to bring the currents into equilibrium when the output voltage varies from the voltage provided at equilibrium; and in which the means for connecting each of said cells in a pair of parallel circuits in which equal current values are generated in an equilibrium condition comprises means for mirroring current in a first one of the parallel current paths through a portion of a second one of the current paths, and in which the means responsive to currents in the pair of parallel circuits for providing an output voltage which may be used as a reference value when the currents are in equilibrium comprises means for sensing the difference between the mirrored current and current through the flash EEPROM memory cell of the second one of the memory paths to vary the output voltage.

6. A precision voltage reference circuit as claimed in claim 5 further comprising means for initializing the currents through the pair of parallel paths at selected equilibrium current values.

7. A precision voltage reference circuit as claimed in claim 5 further comprising means for biasing the reference circuit to function with at least two different source voltages.

8. A precision voltage reference circuit as claimed in claim 7 in which the means for biasing the reference circuit to function with at least two different source voltages comprises charge pump means for selectively providing an output voltage greater than voltages furnished by either of the two different source voltages.

9. A computer system comprising:
central processing means;
bus means;
main memory means; and
means for providing programmable non-volatile long term storage, the last mentioned means including
means for providing a precision voltage reference comprising
a pair of similar flash EEPROM memory cells,
means for connecting each of said cells in a pair of parallel circuits in which equal current values are generated in an equilibrium condition,
means responsive to currents in the pair of parallel circuits for providing an output voltage which may be used as a reference value when the currents are in equilibrium, and
means for sensing variations in the output voltage to vary the current through the flash EEPROM memory cells to bring the currents into equilibrium when the output voltage varies from the voltage provided at equilibrium.

10. A computer system comprising:
central processing means;
bus means;
main memory means; and
means for providing programmable non-volatile long term storage, the last mentioned means including
means for providing a precision voltage reference comprising
a pair of similar flash EEPROM memory cells,
means for connecting each of said cells in a pair of parallel circuits in which equal current values are generated in an equilibrium condition,
means responsive to currents in the pair of parallel circuits for providing an output voltage which may be used as a reference value when the currents are in equilibrium,
means for sensing variations in the output voltage to vary the current through the flash EEPROM memory cells to bring the currents into equilibrium when the output voltage varies from the voltage provided at equilibrium, and
in which the means for providing a precision voltage reference further comprises voltage pump means for generating a voltage sufficient to allow an output voltage which may be used as a reference value of a value sufficient for use with flash EEPROM devices to be established.

11. A computer system comprising:
central processing means;
bus means;
main memory means; and
means for providing programmable non-volatile long term storage, the last mentioned means including means for providing a precision voltage reference comprising
a pair of similar flash EEPROM memory cells,
means for connecting each of said cells in a pair of parallel circuits in which equal current values are generated in an equilibrium condition,
means responsive to currents in the pair of parallel circuits for providing an output voltage which may be used as a reference value when the currents are in equilibrium,
means for sensing variations in the output voltage to vary the current through the flash EEPROM memory cells to bring the currents into equilibrium when the output voltage varies from the voltage provided at equilibrium, and
in which the means for providing a precision voltage reference further comprises means for biasing whereby the means for providing a precision voltage reference operates with a plurality of different source voltages.

* * * * *